United States Patent [19]

Higashi et al.

[11] Patent Number: 4,826,753
[45] Date of Patent: May 2, 1989

[54] LIGHT-SENSITIVE COMPOSITION CONTAINING AN UNSATURATED MONOMER AND A PHOTOPOLYMERIZATION INITIATOR

[75] Inventors: Tatsuji Higashi; Kouichi Kawamura; Yukio Abe, all of Shizuoka, Japan

[73] Assignee: Fuji Photo Film Co., Ltd., Kanagawa, Japan

[21] Appl. No.: 92,885

[22] Filed: Sep. 4, 1987

[30] Foreign Application Priority Data

Sep. 10, 1986 [JP] Japan .................................. 61-213671

[51] Int. Cl.$^4$ ............................................. G03C 1/70
[52] U.S. Cl. .................................... 430/281; 430/175; 430/920; 430/287; 522/26; 522/63
[58] Field of Search .................... 522/26, 63; 430/920, 430/281, 175, 287

[56] References Cited

U.S. PATENT DOCUMENTS 3,954,475  5/1976  Bonham et al. .......................... 96/67
3,987,037  10/1976  Bonham et al. ...................... 260/240

Primary Examiner—Paul R. Michl
Assistant Examiner—Cynthia Hamilton
Attorney, Agent, or Firm—Burns, Doane, Swecker & Mathis

[57] ABSTRACT

A light-sensitive composition containing a polymerizable compound having at least one ethylenically unsaturated group, and a photopolymerization initiator of general formula (I):

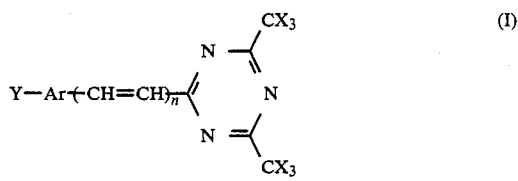

wherein Y represents —COOR$_1$,

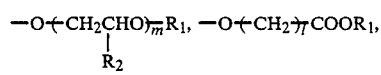

—R$_3$—COOR$_1$, —R$_3$—CONHR$_1$ or —NHCO—R$_4$ (wherein R$_1$ represents a hydrogen atom, an alkyl group, or an aryl group; R$_2$ represents a hydrogen atom or a methyl group; R$_3$ represents an alkylene group; R$_4$ represents an alkyl group, an alkoxy group, an aryl group; and l and m respectively represents integers of 1 to 10.); Ar represents a phenylene, naphthylene or heterocyclic aromatic group; X represents a chlorine atom or a bromine atom; and n represents 1 or 2.

The light-sensitive composition has a good stability over time since crystallization of the photopolymerization initiator on the surface of the light-sensitive layer is inhibited.

12 Claims, No Drawings

LIGHT-SENSITIVE COMPOSITION CONTAINING AN UNSATURATED MONOMER AND A PHOTOPOLYMERIZATION INITIATOR

BACKGROUND OF THE INVENTION

1. Field of the Invention

This invention relates to a light-sensitive composition containing an unsaturated monomer and a photopolymerization initiator, and optionally further containing a linear organic high molecular polymer, and especially to a light-sensitive composition which is capable of providing photohardened images and useful for preparation of presensitized plates from which lithographic printing plates are to be prepared, photoresist or the like. More specifically, the present invention relates to a new light-sensitive composition wherein a phenomenon is inhibited that the photopolymerization initiator moves on the surface of the light-sensitive layer and deposits or in some case aggregates and crystallizes.

2. Description of the Prior Art

Methods for reproducing an image according to photographic processes using, as a light-sensitive composition, a composition comprising a polymerizable ethylenically unsaturated compound and a photopolymerization initiator and if necessary a linear organic high molecular polymer, a thermal polymerization inhibitor, etc. have hitherto been widely known. That is, the light-sensitive composition is photopolymerized by irradiation of actinic light and insolubilized, as disclosed in Japanese Patent Publication for Opposition Purpose (hereinafter referred to as "J.P. KOKOKU") Nos. 35-5093 and 35-8495 and the like. Therefore, a desired photopolymerization image can be formed by making the light-sensitive composition a proper film, irradiating the film with actinic light through a negative transparency of a desired image and removing only unexposed areas with a proper solvent (hereinafter merely referred to as development). It goes without saying that this type of light-sensitive compositions are very useful as light-sensitive materials for presensitized plates, photoresists or the like.

As photopolymerization initiators there are mentioned, for example, vinylhalomethyl-s-triazine compounds disclosed in U.S. Pat. Nos. 3,987,037 and 3,954,475. Compounds described therein as those especially valuable include the following compounds.

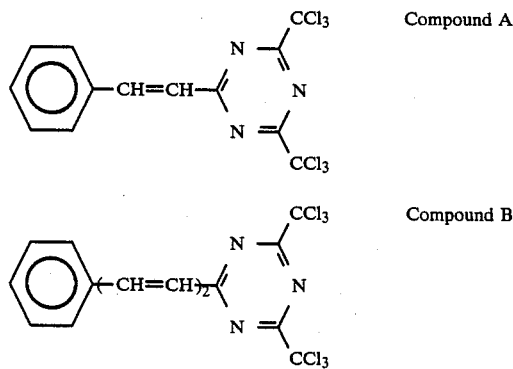

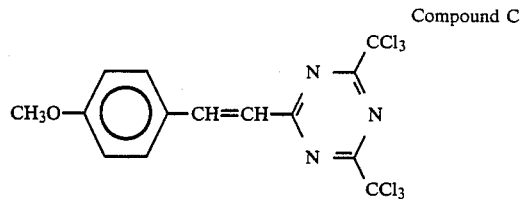

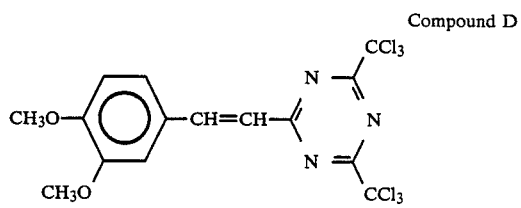

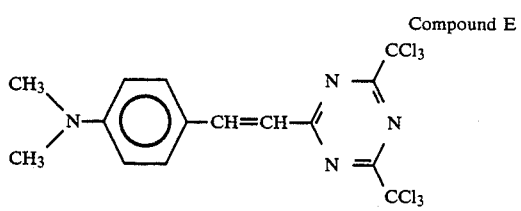

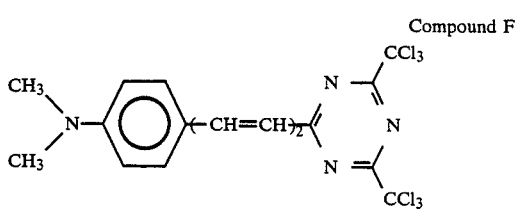

These compounds have a disadvantage of causing during storage a phenomenon that they move onto the surface of the light-sensitive layer and deposit, and in some case aggregate and crystallize (the so-called crystallization phenomenon). Therefore, a light-sensitive composition wherein a above-mentioned photopolymerization initiator is used is poor in stability over time.

SUMMARY OF THE INVENTION

Thus, an object of the present invention is to provide light-sensitive compositions having a good stability on time lapse without crystallization of the photopolymerization initiator on the surface of the light-sensitive layer with time lapse when the compositions are used in presensitized plates, photoresists, etc.

Under the above present state of techniques, the present inventors have found as a result of vigorous studies, that the above problems can be solved by light-sensitive materials in which certain triazine compounds are used as a photopolymerization initiators, and have attained the present invention.

The present invention provides a light-sensitive composition containing a polymerizable compound having at least one ethylenically unsaturated group and a photopolymerization initiator of general formula (I):

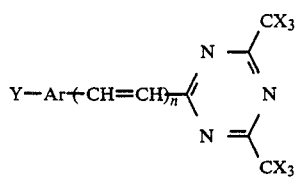

(I)

wherein Y represents —COOR$_1$,

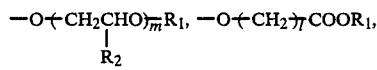

—R$_3$—COOR$_1$, —R$_3$—CONHR$_1$ or —NHCO—R$_4$ (wherein R$_1$ represents a hydrogen atom, an alkyl group which may be substituted or an aryl group which may be substituted; R$_2$ represents a hydrogen atom or a methyl group; R$_3$ represents an alkylene group; R$_4$ represents an alkyl group which may be substituted; an alkoxy group or an aryl group which may be substituted; and l and m respectively represent integers of 1 to 10.); Ar represents a substituted or unsubstituted phenylene, naphthylene or heterocyclic aromatic group; X represents a chlorine atom or a bromine atom; and n represents 1 or 2.

The "polymerizable compound having at least one ethylenically unsaturated group" used in the present invention is a monomer or oligomer having a boiling point of 100° C. or more at normal pressure and a molecular weight of 10,000 or less, and having one or preferably two or more ethylenically unsaturated groups capable of addition polymerization. Examples of such a monomer or oligomer include polyethylene glycol mono(meth)acrylate, polypropylene glycol mono(meth)acrylate, phenoxyethyl(meth)acrylate and other monofunctional acrylates and methacrylates; and polyethylene glycol di(meth)acrylate, polypropylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol di(meth)acrylate, tri(acryloyloxyethyl) isocyanurate, compounds obtained by addition of ethylene oxide or propylene oxide to a polyvalent alcohol such as glycerol or trimethylolethane and subsequent (meth)acrylation of the ddduct, such urethane acrylates as disclosed in J.P. KOKOKU Nos. 48-41708 and 50-6034 and Japanese Patent Unexamined Published Application (hereinafter referred to as "J.P. KOKAI") No. 51-37193, polyester acrylates disclosed in J.P. KOKAI No. 48-64183 and J.P. KOKOKU Nos. 49-43191 and 52-30490, epoxyacrylates obtained by reaction of an epoxy resin with (meth)acrylic acid, and other polyvalent acrylates and methacrylates. Further, compounds disclosed as the monomers and oligomers in Bulletin of Japan Adhesion Society vol. 20, No.7, pages 300 to 308 can also be used. The amount of the monomer or oligomer to be used in the present invention is 5 to 50 weight % (hereinafter merely referred to as %), preferably 10 to 40% based on the total composition.

In the compounds represented by general formula (I) as photopolymerization initiators to be used in the present invention, the alkyl group R$_1$ is preferably those having 1 to 18 carbon atoms; the substituted alkyl group R$_1$ is preferably those having 1 to 18 carbon atoms and having as a substitutent a hydroxyl group, a halogen atom such as a fluorine, chlorine or bromine atom, an amido group such as

a carboxyl group or the like; the aryl group R$_1$ is preferably a phenyl group or a naphthyl group; and the substituted aryl group R$_1$ is preferably a phenyl or naphthyl group having as a substituent a hydroxyl group, a halogen atom such as a fluorine, chlorine or bromine atom, an amido group such as

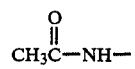

or a carboxyl group.

The alkylene group R$_3$ is preferably those having 1 to 10 carbon atoms. The alkyl group and the substituted alkyl group represented by R$_4$ are preferably the same alkyl group and substituted alkyl group as in the above R$_1$; the alkoxy group R$_4$ is preferably those having 1 to 8 carbon atoms; and the aryl group and the substituted aryl group represented by R$_4$ are preferably the same aryl group and substituted aryl group as in the above R$_1$. The heterocyclic aromatic group Ar is preferably those derived from a thiophene ring or a pyrrole ring; and each substituent of the substituted phenylene group, the substituted naphthylene group and the substituted heterocyclic aromatic group is preferably an alkyl group having 1 to 3 carbon atoms, a halogen atom such as a fluorine, chlorine or bromine atom, an amido group such as

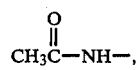

a carboxyl group or the like.

Examples of especially preferred photopolymerization initiators among the compounds represented by general formula (I) to be used in the present invention are demonstrated below but the present invention is not limited thereto.

Compound 1

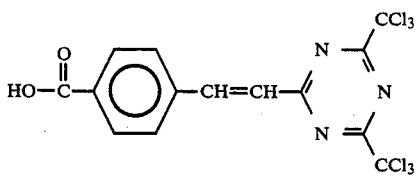

Compound 2

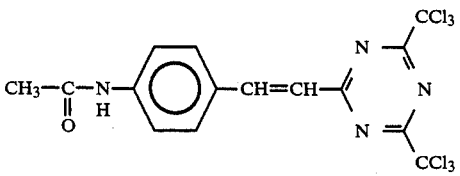

-continued

Compound 3
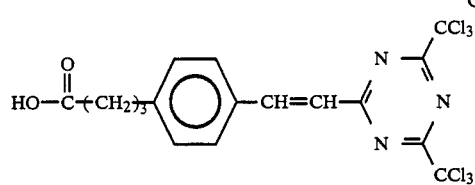

Compound 10
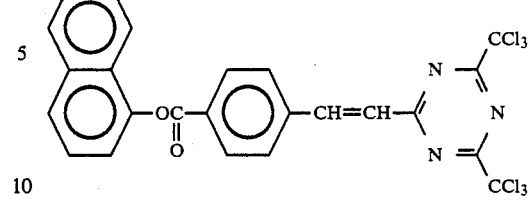

Compound 4
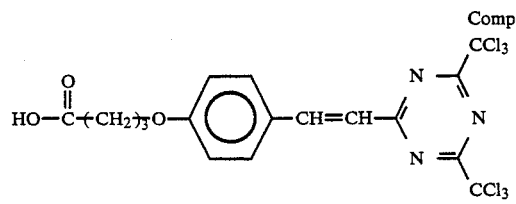

Compound 11
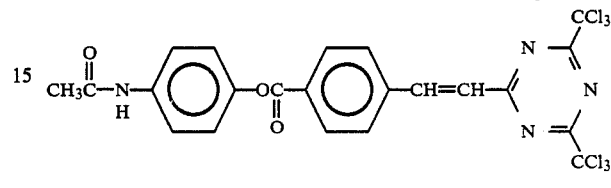

Compound 5
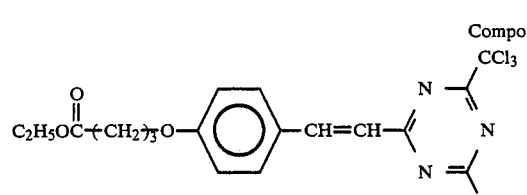

Compound 12
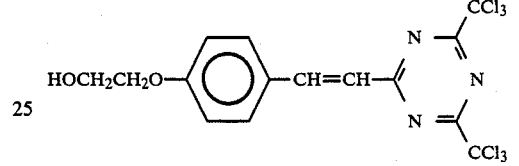

Compound 6
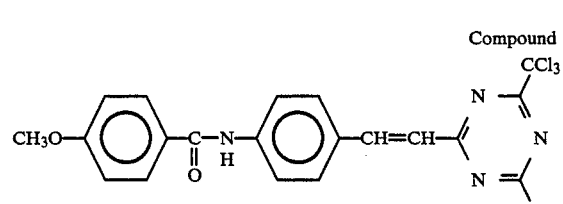

Compound 13
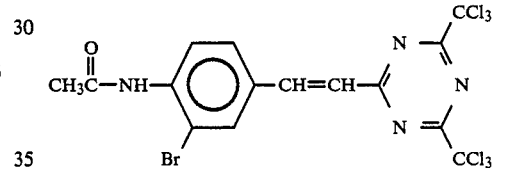

Compound 7
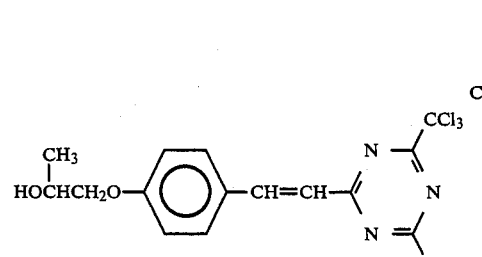

Compound 14
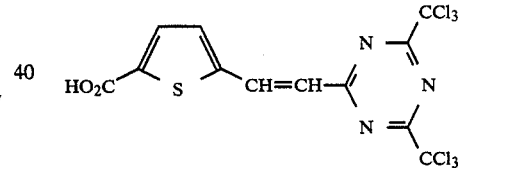

Compound 8
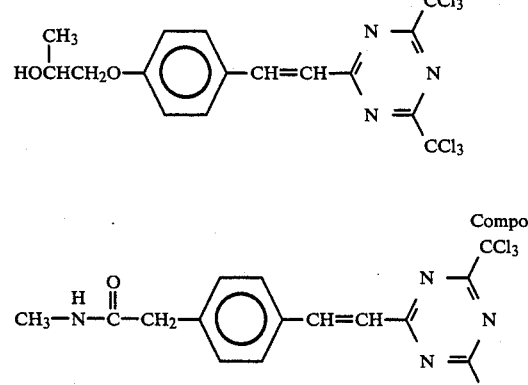

A compound represented by general formula (I) can be synthesized by methods disclosed in UK Patent No. 1,388,492, that is, be refluxing with heating a mexture of an aldehyde represented by the general formula Y—Ar—CHO (n=1)

or

Y—Ar—CH=CH—CHO (n=2)

(wherein Y and Ar have the same meaning as in general formula (I)) and 4-methyl-2,6-di(trichloromethyl)triazine in toluene under a dehydration condition using piperidium acetate as a catalyst.

Compound 9
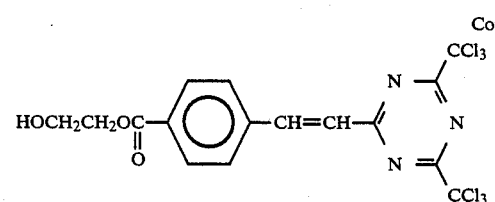

Usually, only a small amount of the photopolymerization initiator is incorporated in the composition of the present invention, and an improperly large content thereof causes undesirable results such as shielding of effective rays. The photopolymerization initiator represented by general formula (I) in the present invention is usually used in an amount of 0.01 to 20%, preferably 1 to 10% based on the polymerizable ethylenically unsaturated compound or based on the total of the photopolymerizable ethylenically unsaturated compound and the linear organic high molecular polymer when the latter is used.

The photopolymerization-initiating ability of the photopolymerization initiator used in the present invention can be enhanced by adding a hydrogen-offering type compound such as N-phenylglycine, 2-mercaptobenzothiazole or alkyl N,N-dialkylbenzoate; such a 9,10-diphenylanthracene as disclosed in Japanese Patent Application No. 61-56377; such a 9-phenylcarbazole as disclosed in Japanese Patent Application No. 61-56378; or the like.

The "linear organic high molecular polymer" usable in the present invention must naturally have compatibility with the polymerizable ethylenically unsaturated compound. Any linear organic high molecular polymer can be used so long as it is compatible with the polymerizable ethylenically unsaturated compound, but it is desirable to select a linear organic high molecular polymer which makes development in water or in weakly alkaline water possible. The linear organic high molecular polymer is used not only as a film-forming agent for the composition, but also in accordance with use for a water, weakly alkaline water or organic solvent developing agent. For example, development in water is made possible by use of a water soluble organic high molecular polymer. Examples of suitable linear organic high molecular polymer include addition polymers having carboxyl groups in the side chain such as methacrylic acid copolymers, itaconic acid copolymers, crotonic acid copolymers, maleic acid copolymers and partially esterified maleic acid copolymers; acidic cellulose derivatives having carboxyl groups in the side chain. In addition, compounds obtained by adding a cyclic acid anhydride to an addition polymer having hydroxyl groups, etc. are useful. Further, as a water soluble linear organic high molecular polymer, polyvinylpyrrolidone, polyethylene oxide or the like is useful. Further, alcohol soluble nylons and polyether obtained from 2,2-bis-(4-hydroxyphenyl)propane and epichlorohydrin are useful. Though each of these linear organic high molecular polymers may be incorporated in the composition in an arbitrary amount, content thereof exceeding 90% based on the total composition does not give a good result with respect to image intensity to be formed or the like.

Further, in the present invention, a diazo resin may be added besides the above fundamental components. As such a diazo resin, one which is of negative working type and is substantially insoluble in water and soluble in an organic solvent is suitable. Such a diazo resin includes a product obtained by the reaction of an anion with a condensate obtained by condensing a diazomonomer with a condensing agent in a molar ratio of 1:1–1:0.5, preferably 1:0.8–1:0.6 according to a usual method. Examples of the diazomonomer include 4-diazo-diphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-P-tolylmercaptobenzene, 1-diazo-2ethoxy-4-N,N-dimethylaminobenzene, P-diazo-dimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-P-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-diazodiphenylamine, 3-ethoxy-4-diazodiphenylamine, 3-(n-propoxy)-4-diazodiphenylamine, 3-(isopropoxy)-4-diazodiphenylamine and the like. Examples of the condensing agent include formaldehyde, acetaldehyde, propionaldehyde, butyraldehyde, isobutyraldehyde, benzaldehyde and the like. Examples of the anion include tetrafluoroboric acid, hexafluorophosphoric acid, triisopropylnaphthalenesulfonic acid, 5-nitro-ortho-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, paratoluenesulfonic acid and the like. Among these anions, hexafluorophosphoric acid, and alkyl aromatic sulfonic acids such as triisopropylnaphthalenesulfonic acid and 2,5-dimethylbenzenesulfonic acid are preferred.

Further, diazo resins disclosed in U.S. Pat. No. 3,867,147 are also suitable.

These diazo resins in the present invention are used in an amount of 1 to 30%, preferably 3 to 15% based on the total composition.

Further, it is possible to add, if necessary, phosphoric acid, phosphorous acid, tartaric acid, citric acid, malic acid, dipicolinic acid, polynuclear aromatic sulfonic acid or a salt thereof, sulfosalicylic acid as a stabilizer of the diazo resin.

Further, it is also possible to add a higher aliphatic acid and a higher aliphatic acid amide such as behenic acid and behenic acid amide, etc. disclosed in U.S. Pat. Application, Ser. No. 872,389 filed June 10, 1986, in order to exclude the influence of oxygen during exposure to light.

Further, it is possible to add a matting agent in order to enhance vacuum adhesion during exposure to light and thereby to decrease quickly oxygen concentration on the surface of the light-sensitive layer.

Further, it is desirable in the present invention to add a small amount of a thermal polymerization inhibitor besides the above fundamental components in order to inhibit undersirable thermal polymerization of the polymerizable ethylenically unsaturated compound during the preparation or preservation of the light-sensitive composition. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, Cerous salt of N-nitrosophenylhydroxyamine and the like.

Further, in some occasion, a dye or a pigment for coloring the light-sensitive layer and an inorganic filler for improving physical properties of the hardened film may be added.

The photopolymerizable composition of the present invention may be dissolved in a single or properly mixed solvent of 2-methoxyethanol, 2-methoxyethyl acetate, propylene glycol monomethyl ether, 3-methoxypropanol, 3-methoxypropyl acetate, methyl ethyl ketone, ethylenedichloride and/or the like, and coated on a support. Proper coating amount thereof is about 0.1 to 10 g/m², preferably 0.5 to 5 g/m² based on the weight after drying.

Further, it goes without saying that the photopolymerizable composition of the present invention can contain other known additives such as a printing-out agent, for accomplishing the desired objects.

As the support, a plate material having dimensional stability is used. Such plate materials having dimensional stability include supports of lithographic printing plates which have hitherto been used. Examples of such support materials include papers; papers laminated with plastic such as polyethylene, polypropylene or polystyrene; metal plates such as aluminum (including aluminum alloy), zinc and copper; films of plastics such as cellulose diacetate, cellulose triacetate, cellulose propionate, cellulose butyrate, cellulose acetate butyrate, cellulose nitrate, polystyrene terephthalate, polyethylene, polystyrene, polypropylene, polycarbonate and polyvinylacetal; papers or plastics laminated with or deposited with such a metal as abovementioned; and the like. Among these supports, an aluminum plate is especially preferable because of its remarkable dimensional stability and cheapness. Furhter, such a composite sheet as disclosed in J.P. KOKOKU No. 48-18327 wherein an aluminum sheet is bonded on a polyethylene terephthalate film is also preferable.

In case of a support having a surface of a metal, especially aluminum, it is preferable that the support is subjected to a surface treatment such as a graining treatment, an immersing treatment in an aqueous solution of sodium silicate, potassium fluorozirconate, phosphoric acid or the like, or anodization. Further, an aluminum plate grained and then subjected to an immersing treatment in a sodium silicate solution as is disclosed in U.S. Pat. No. 2,714,066, and an aluminum plate anodized and then subjected to an immersing treatment in an aqueous alkali metal silicate solution, as is disclosed in U.S. Pat. No. 3,181,461, are also preferably used. The anodization is carried out by applying an electric current to an electrolyte consisting of an aqueous or nonaqueous solution of one or more of inorganic acids such as phosphoric acid, chromic acid, sulfuric acid and boric acid; organic acids such as oxalic acid and sulfamic acid; and salts of these inorganic or organic acids, using an aluminum plate as anode.

Further, such silicate electrodeposition as disclosed in U.S. Pat. No. 3,658,662 is also effective.

Further, a combined surface treatment of such electrolytic graining as disclosed in J.P. KOKOKU No. 61-27481 and J.P. KOKAI Nos. 52-58602 and 52-30503, the above anodization and sodium silicate treatment is also useful.

Further, such an aluminum support successively subjected to brush graining, electrolytic graining, anodization and sodium silicate treatment as disclosed in J.P. KOKAI No. 56-28893 is also preferable.

Further, an aluminum support subjected to undercoat using a water soluble resin such as polyvinylphosphonic acid, a polymer or copolymer having sulfonic acid groups in the side chain or a polyacrylic acid after these treatments were made is preferably used, too.

These hydrophilizing treatments are made, besides for making the surface of the support hydrophilic, for inhibiting a harmful reaction of the photopolymerizable composition provided thereon, further for enhancing adhesion of the light-sensitive layer, or for other purposes.

A protective layer consisting of a polymer having an excellent oxygen-shielding property such as polyvinyl alcohol or an acidic cellulose may be provided on the layer of the photopolymerizable composition which was provided on the support in order to completely inhibit a polymerization-inhibiting action of oxygen in air. Methods for providing such a protective layer are detailedly disclosed, for example, in U.S. Pat. No. 3,458,311 and J.P. KOKOKU No. 55-49729.

A presensitized plate obtained by providing the photopolymerizable composition of the present invention on a support is image-wise exposed using a light source abundant in ultraviolet ray such as a metal halide lamp or a high pressure mercury lamp, treated with a developing solution to remove unexposed areas of the light-sensitive layer, and finally coated with a desensitizing gum solution to prepare a lithographic printing plate. Preferred examples of the above developing solution are aqueous alkali solutions containing a small amount of an organic solvent such as benzyl alcohol, 2-phenoxyethanol or 2-butoxyethanol, and include, for example, those disclosed in U.S. Pat. Nos. 3,475,171 and 3,615,480.

Further, developing solutions disclosed in J.P. KOKAI No. 50-26601 and J.P. KOKAI Nos. 56-39464 and 56-42860 are also excellent as a developing solution for the above presensitized plate.

The present invention is further explained by examples, but should not be limited thereto.

EXAMPLES 1 to 14

The surface of a 0.30 mm thick aluminum plate was grained using a nylon brush and an aqueous suspension of 400 mesh pumice stones, and wall washed with water. The resulting plate was immersed in 10% sodium hydroxide at 70° C. for 60 seconds for etching, washed with water, neutralized and washed with 20% $HNO_3$, and washed. The plate was then subjected to an electrolytic roughening treatment in an aqueous 1% nitric acid solution at an electricity quantity at an anodic state of 160 coulombs/dm² using alternating waveform current of sine wave under the condition fo $V_A = 12.7$ V. Surface roughness thereof was measured to be 0.6 μ (expressed in Ra). Then, the plate was immersed in an aqueous 30% $H_2SO_4$ solution at 50° C. for 2 minutes to conduct desmutting, and anodized in an aqueous 20% $H_2SO_4$ solution for 2 minutes so as to make the thickness of anodized coating 2.7 g/m² at a current density of 2 A/dm². The resulting plate was immersed in an aqueous 2.5% sodium silicate solution at 70° C. for one minute, washed and dried.

A light-sensitive solution of the following composition was coated on the thus treated aluminum plate so as to make dry coating weight 2 g/m², and dried at 100° C. for 2 minutes to obtain a presensitized plate. Photopolymerization initiators used are shown in Table 1.

| Composition of the light-sensitive solution | |
|---|---|
| Trimethylolpropane triacrylate | 1 g |
| Copolymer of allyl methacrylate/ methacrylic acid (Molar ratio of copolymerization 85/15) | 3 g |
| Photopolymerization initiator (shown in Table 1) | 0.1 g |
| Dodecylbenzenesulfonate of the condensate of p-diazodiphenylamine with formaldehyde | 0.15 g |
| Oil Blue #603 (Manufactured by ORIENT CHEMICAL | 0.05 g |

-continued

| Composition of the light-sensitive solution | |
|---|---|
| INDUSTRY CO., LTD.) | |
| Behenic acid | 0.05 g |
| Behenic acid amide | 0.05 g |
| F-177 (a fluorine surfactant, manufactured by DAINIPPON INK AND CHEMICALS INC.) | 0.05 g |
| Ethylene glycol monomethyl ether | 25 g |
| Methanol | 7.5 g |
| Methyl ethyl ketone | 15 g |

The obtained presensitized plate was allowed to stand at 60° C. for 5 days. The surface of the resulting plate was observed by a microscope, rubbed with a filter paper and subjected to extraction with methanol. The extract was subjected to UV measurement to examine whether crystallization of the photopolymerization initiator occurred. The results are shown in Table 1.

Analysis of the crystallized parts of the samples of Comparative examples 1 to 9 revealed that these parts are respective photopolymerization initiators.

The photopolymerization initiators of general formula (I) wherein Y is a polar group gives especially good results.

Further, each of the presensitized plates obtained in Examples 1 to 14 was left for 5 days either at 25° C. (in the laboratory) or at 60° C.

Fuji PS step tablet manufactured by FUJI PHOTO FILM CO., LTD., (a gray scale wherein transmission density discontinuously changes at $\Delta D = 0.15$) was contacted on the light-sensitive layer of the resulting presensitized plate, and exposure to light was carried out at a distance of 70 cm using a 10 ampere high pressure mercury lamp.

Development was carried out using a developing solution having the following composition disclosed in J.P. KOKOKU No. 56-42860 to remove unexposed areas.

| Composition of the developing solution | |
|---|---|
| Sodium sulfite | 3 g |
| Benzyl alcohol | 30 g |
| Triethanolamine | 20 g |
| Monoethanolamine | 5 g |
| PELEX NBL (sodium t-butylnaphthalenesulfonate, manufactured by KAO ATLAS COMPANY) | 30 g |
| Water | 1000 g |

Exposure time which was required for the third step of the gray scale to completely become solid was measured for each of the samples after the leaning at 25° C. or 60° C. for 5 days. The results are shown in Table 1.

As shown in Table 1, in any of the samples of Examples to 14 wherein crystallization of the photopolymerization initiators was not seen, there was seen no difference between exposure times for the third step of the step tablet to completely become solid either at 25° C. or 60° C. However, in any of the samples of Comparative examples 1 to 9, samples which were left at 60° C. took longer exposure time.

TABLE 1

| Experiment No. | Photopolymerization initiator | Presence of crystallization | Exposure time for the 3rd step of the step tablet to completely become solid | |
|---|---|---|---|---|
| | | | Left at 25° C. for 5 days (seconds) | Left at 60° C. for 5 days (seconds) |
| Example 1 | Compound 1 | NO | 200 | 200 |
| Example 2 | Compound 2 | NO | 150 | 150 |
| Example 3 | Compound 3 | NO | 50 | 50 |
| Example 4 | Compound 4 | NO | 50 | 50 |
| Example 5 | Compound 5 | NO | 50 | 50 |
| Example 6 | Compound 6 | NO | 100 | 100 |
| Example 7 | Compound 7 | NO | 50 | 50 |
| Example 8 | Compound 8 | NO | 80 | 80 |
| Example 9 | Compound 9 | NO | 200 | 200 |
| Example 10 | Compound 10 | NO | 150 | 150 |
| Example 11 | Compound 11 | NO | 200 | 200 |
| Example 12 | Compound 12 | NO | 50 | 50 |
| Example 13 | Compound 13 | NO | 80 | 80 |
| Example 14 | Compound 14 | NO | 70 | 70 |
| Comparative example 1 | Compound A | YES | 200 | 350 |
| Comparative example 2 | Compound B | YES | 70 | 100 |
| Comparative example 3 | Compound C | YES | 50 | 90 |
| Comparative example 4 | Compound D | YES | 100 | 150 |
| Comparative example 5 | Compound E | YES | 350 | 700 |
| Comparative example 6 | Compound F | YES | 500 | 1,000 |
| Comparative example 7 | 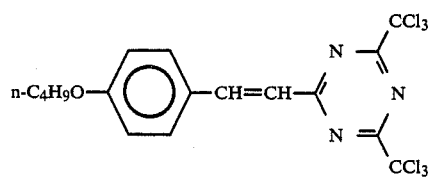 | YES | 50 | 100 |

TABLE 1-continued

| Experiment No. | Photopolymerization initiator | Presence of crystallization | Exposure time for the 3rd step of the step tablet to completely become solid | |
|---|---|---|---|---|
| | | | Left at 25° C. for 5 days (seconds) | Left at 60° C. for 5 days (seconds) |
| Comparative example 8 | 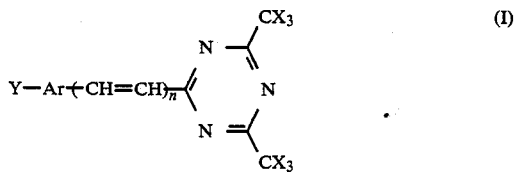 | YES | 200 | 300 |
| Comparative example 9 | 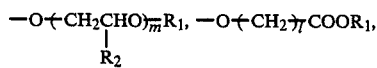 | YES | 140 | 420 |

As is seen from the foregoing, in accordance with the present invention, now light-sensitive materials can be provided wherein a phenomenon that the photopolymerization initiator moves to and deposits on the surface of the light-sensitive layer, and in some case further aggregates to crystallize, is inhibited.

What is claimed is:

1. A light-sensitive composition containing a polymerizable compound having at least one ethylenically unsaturated group, and a photopolymerization initiator of general formula (I):

$$Y-Ar+CH=CH)_n \underset{N=}{\overset{N-}{\bigg\langle}} \underset{CX_3}{\overset{CX_3}{\bigg\rangle}} \quad (I)$$

wherein Y represents $-O+CH_2CHO)_m R_1$, $-O+CH_2)_l COOR_1$,
            |
            $R_2$ $-R-COOR_1$, $-R_3-CONHR_1$ or $-NHCO-R_4$ wherein $R_1$ represents a hydrogen atom, a substituted or unsubstituted alkyl group or a substituted or unsubstituted aryl group; $R_2$ represents a hydrogen atom or methyl group; $R_3$ represents an alkylene group; $R_4$ represents a substituted or unsubstituted alkyl group, an alkoxy group or a substituted or unsubstituted aryl group; and l and m respectively represents integers of 1 to 10; Ar represents a phenylene, naphthylene or heterocyclic aromatic group; X represents a chlorine atom or a bromine atom; and n represents 1 or 2.

2. The light-sensitive composition of claim 1, wherein $R_1$ is an alkyl group having 1 to 18 carbon atoms; an alkyl group having 1 to 18 carbon atoms and substituted with a hydroxyl group, a halogen atom, an amido group or a carboxyl 3. The light-sensitive composition of claim 1, wherein $R_3$ is an alkylene group having 1 to 10 carbon atoms.

4. The light-sensitive composition of claim 1, wherein $R_4$ is an alkyl group having 1 to 18 carbon atoms; an alkyl group substituted with a hydroxyl group, a halogen atom, an amido group or a carboxyl group; an alkoxy group having 1 to 8 carbon atoms; a phenyl group or a naphthyl group; or a phenyl group or a naphthyl group substituted with a hydroxyl group, a halogen atom, an amido group or a carboxyl group.

5. The light-sensitive composition of claim 1, wherein Ar is a divalent group formed by removing two hydrogen atoms from a thiophene molecule or a pyrrole molecule; or a phenylene, naphthylene or heterocyclic aromatic group substituted with an alkyl group having 1 to 3 carbon atoms, a halogen atom, an amido group or a carboxyl group.

6. The light-sensitive composition of claim 1, wherein the photopolymerization initiator is used in an amount of 0.01 to 20 weight % based on the monomer.

7. The light-sensitive composition of claim 1, wherein the photopolymerizable compound is a monomer or oligomer having a boiling point of 100° C. or more at normal pressure, at least one ethylenically unsaturated group capable of addition polymerization and a molecular weight of 10,000 or less.

8. The light-sensitive composition of claim 1, wherein a linear organic high molecular polymer is further contained.

9. The light-sensitive composition of claim 8, wherein the linear organic high molecular polymer is compatible with the photopolymerizable compound and soluble in water or an aqueous weakly alkali solution.

10. The light-sensitive composition of claim 8, wherein the photopolymerizable compound is used in an amount of 5 to 50 weight % based on the whole composition.

11. The light-sensitive composition of claim 8, wherein the linear organic high molecular polymer is used in an amount of 90 weight % or less based on the whole composition.

12. The light-sensitive composition of claim 8, wherein the photopolymerization initiator is used in an amount of 0.01 to 20 weight % based on the total of the photopolymerizable compound and the linear organic high molecular polymer.

* * * * *